United States Patent
Moss et al.

[19]

[11] Patent Number: 6,144,549
[45] Date of Patent: Nov. 7, 2000

[54] PERIPHERAL BAY FLAT PANEL DISPLAY MODULE FOR COMPUTER

[75] Inventors: David L. Moss; Timothy C. Dearborn, both of Austin, Tex.

[73] Assignee: Dell USA, L.P., Round Rock, Tex.

[21] Appl. No.: 09/041,143

[22] Filed: Mar. 12, 1998

[51] Int. Cl.[7] .............................. H05K 5/00; A47B 81/00; G05B 11/01

[52] U.S. Cl. .......................... 361/681; 361/683; 361/724; 312/223.1; 312/223.2; 364/146; 345/169; 345/905

[58] Field of Search .................................... 361/681, 682, 361/724, 683; 248/917; 345/169, 905; 312/223.1, 223.2, 223.3, 223.4, 223.5, 223.6; 364/146

[56] References Cited

U.S. PATENT DOCUMENTS

| | | | |
|---|---|---|---|
| 5,146,390 | 9/1992 | Wong | 361/427 |
| 5,173,686 | 12/1992 | Fujihara | 340/700 |
| 5,337,212 | 8/1994 | Bartlett et al. | 361/681 |
| 5,345,362 | 9/1994 | Winkler | 361/681 |
| 5,388,032 | 2/1995 | Gill et al. | 364/146 |
| 5,471,099 | 11/1995 | Larabell et al. | 307/53 |
| 5,673,029 | 9/1997 | Behl et al. | 340/635 |

OTHER PUBLICATIONS

CRD–5500 CMD Storage brochure, CMD Technology, Inc., Irvine, California, Apr. 1997 (4 pages).
CRD–5440 CMD Storage brochure, CMD Technology, Inc., Irvine, California, Apr. 1997 (2 pages).

*Primary Examiner*—Leo P. Picard
*Assistant Examiner*—Tung Minh Bui
*Attorney, Agent, or Firm*—Skjerven Morrill Macpherson LLP; Marc R. Ascolese

[57] ABSTRACT

A flat panel display (FPD) module can be mounted into a peripheral device bay of a computer system. The peripheral device bay of a convertible computer system is rotatable, allowing the FPD module to be mounted in a horizontal orientation regardless of the computer system's orientation. Additionally, the FPD panel of the module is rotatable so that the panel can be pivoted into an orientation convenient for viewing. The FPD module includes a sled having a front panel and a pair of opposing side panels, the front panel and side panels defining an interior portion. An FPD panel, such as a liquid crystal display (LCD), is mounted in a frame rotatably coupled to the sled. At least one mounting feature is located on one of the side panels for mounting the module into a peripheral device bay.

24 Claims, 2 Drawing Sheets

PERIPHERAL BAY FLAT PANEL DISPLAY MODULE FOR COMPUTER

BACKGROUND OF THE INVENTION

1. Field of the Invention

This invention relates to computer modules with flat panel displays (FPDs), and particularly to liquid crystal display (LCD) modules installed in a peripheral device bay of a computer system.

2. Description of the Related Art

Many computer systems, including personal computers, workstations, servers, and embedded systems are designed to have multiple peripheral devices included in the system. A typical personal computer system includes a processor, associated memory and control logic and a number of peripheral devices that provide input and output (I/O) for the system. Such peripheral devices include, for example, compact disk read-only memory (CD-ROM) drives, hard disk drives, floppy disk drives, and other mass storage devices such as tape drives, compact disk recordable (CD-R) drives or digital video/versatile disk (DVD) drives. Additionally, computer systems often have the capability to interface with external enclosures that include additional peripheral devices.

A network server is a focal point for processing and storage in a network, as the network server is responsible for distribution of application programs and data to client computer systems. Server computer systems often require a feature on the front of the server to communicate critical system status information, e.g. component failure, network status, and peripheral operation, to the user. Communicating other, non-critical information to the user is another useful feature found in servers. A flat panel display (FPD) such as a multi-character or dot-matrix liquid crystal display (LCD) provides a good vehicle for displaying both critical and non-critical system information. Consequently many servers incorporate an LCD on the front of the server chassis.

However, incorporating an FPD into a servers proves to be a challenge for several reasons. Computer system form factors generally, and server form factors in particular, continue to get smaller, leaving little or no space on the front of the system for an FPD unit and leaving little or no space within the chassis to accommodate the display's support electronics. Moreover, some server form factors are designed to be convertible, by rotating the chassis 90°, for use as a vertically oriented tower system or a horizontally oriented desktop or rack-mounted system. In order to properly display information via an FPD, the display unit should remain horizontal to the user. Allowing the FPD to remain horizontal after the server is rotated for the required customer orientation requires the FPD unit to be rotatable relative to the server. A rotatable FPD unit requires more space than a fixed FPD unit, and adds to the complexity and cost of the device.

Additionally, servers with FPD units can be located in a variety of different positions relative to a convenient viewing position for a user. For example, a rack-mounted server including an FPD unit can be mounted at the bottom of a rack. Consequently, a user who is standing and looking down at the display may have difficulty reading it because of the viewing angle. Under these circumstances, the user is forced to adapt to the FPD unit's location, inconveniencing the user and generally detracting from the server's ease of use.

Accordingly, it is desirable to have an FPD unit that can be properly oriented for viewing regardless of the orientation of the computer system in which it is mounted. It is also desirable that such an FPD unit consume as little additional space inside and on the front of the computer system in which it is mounted, and that the FPD is viewable from a variety of angles, thereby minimizing a user's need to adapt his or her viewing position.

SUMMARY OF THE INVENTION

It has been discovered that a FPD module can be mounted into a peripheral device bay of a computer system. The peripheral device bay of a convertible computer system is rotatable or can accommodate peripheral devices in several different orientations, allowing the FPD module to be mounted in a horizontal orientation regardless of the computer system's orientation. Additionally, the FPD panel of the module is rotatable so that the panel can be pivoted into an orientation convenient for viewing.

Accordingly, one aspect of the present invention provides a flat panel display (FPD) module. The FPD module has a sled including a front panel and a pair of opposing side panels, the front panel and side panels defining an interior portion. The FPD module also includes an FPD panel mounted in a frame rotatably coupled to the sled, and at least one mounting feature located on one of the side panels for mounting the module into a peripheral device bay.

In another aspect of the invention, a computer system includes a processor, a memory coupled to the processor, a chassis supporting the processor and the memory, and a flat panel display (FPD) module coupled to the chassis. The FPD module has a sled including a front panel and a pair of opposing side panels, the front panel and side panels defining an interior portion. The FPD module also includes an FPD panel mounted in a frame rotatably coupled to the sled, and at least one mounting feature located on one of the side panels for mounting the module into the chassis.

The FPD module of the present invention advantageously provides computer systems, including servers, with system management functions using existing peripheral device bay space instead of requiring additional space in the computer system. Consequently, the FPD module allows system management functions to be offered in computer systems that might not otherwise have the functions, and allows the system management functions to be an easily added option to computer systems. Another advantage of the FPD module is that it provides a variable orientation FPD panel so that the panel can more easily be viewed. Furthermore, because the FPD module is designed for use in a peripheral device bay, it can accommodate large FPD panels that can extend from and retract into the peripheral device bay.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
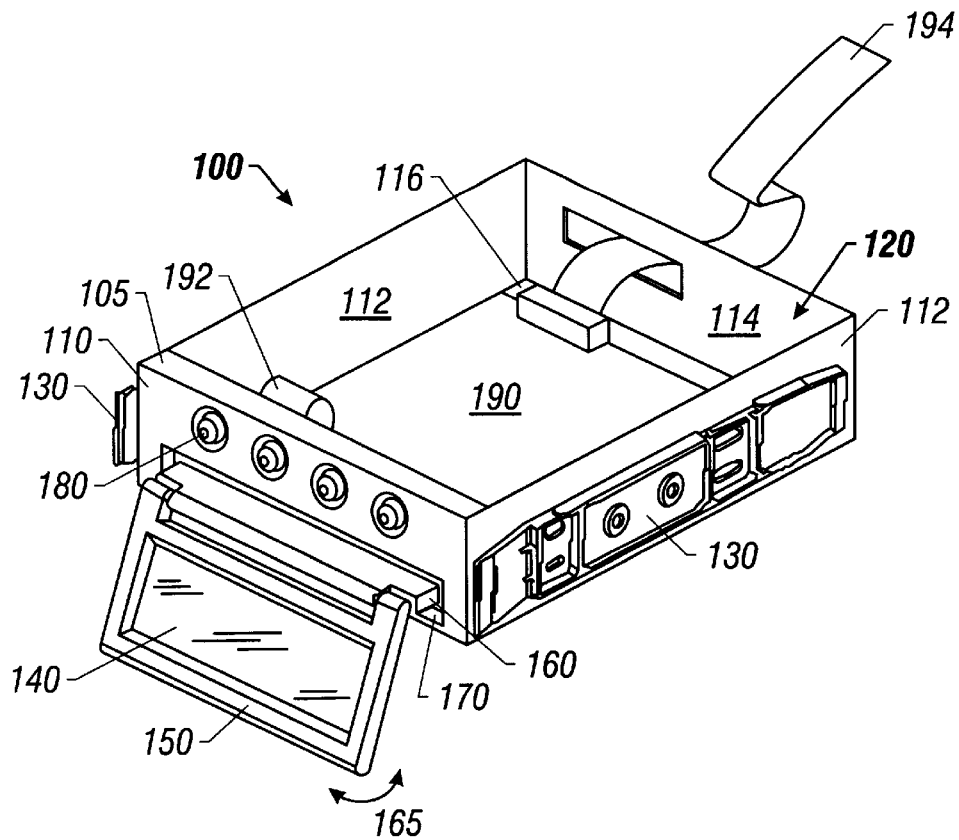
FIG. 1 is a perspective view of an FPD module for mounting in the peripheral device bay of a computer system.

FIG. 1 illustrates an FPD module 100 that can be mounted into the peripheral device bay or chassis of a computer system. FPD module sled 105 includes a front panel 110, a pair of opposing side panels 112, a rear panel 114, and a bottom panel 116. Together, panels 110, 112, 114, and 116 define an interior portion of the sled 120. Side panels 112 have rails 130 that serve as mounting features for mounting the FPD module into a peripheral device bay or chassis. A variety of different mounting features can be used in place of rails 130, and the mounting features can be integrally formed from side panels 112, e.g. slots or mounting holes, or mounted to the side panels as is the case with rails 130.

FPD panel 140 is mounted in frame 150 which, in turn, is attached to tray 160. FPD panel 140 displays system information provided to the panel by interface electronics that can be located within frame 150, on printed circuit board 190, or elsewhere in a computer system. In addition to housing the FPD panel, frame 150 rotatably attaches to tray 160 thereby allowing the panel and frame to be pivoted through a variety of different viewing angles in the directions indicated by arrows 165. In a preferred embodiment, frame 150 can be rotated through an angle greater than 180° so that whether FPD module 100 is located above or below a user's eye level, the frame can be adjusted for convenient viewing of the panel.

Frame 150 is rotatably attached to tray 160 by any appropriate rotation device including, pins, axles, bearings, hinges and clutch/shaft systems. For example, frame 150 can include shafts that project toward tray 160 and are received by clutches located in tray 160. Alternatively, tray 160 can have shafts that project outwardly toward frame 150 and are received by clutches within the frame. A rotation device used can require a sufficiently high torque for movement so that when no additional torque is applied, the frame will be held in position despite the torque exerted on the rotation mechanism by the frame and panel's weight. Alternatively, the rotation device can include detents or catches that allow the frame and panel to be locked or temporarily held in a variety of different positions throughout their range of rotation.

Tray 160 is slidably attached to sled 105 and can extend at least partially through aperture 170 in front panel 110. Consequently, when frame 150 is rotated so that FPD panel 140 is substantially perpendicular to front panel 110, the tray, panel and frame can retract into interior portion 120 of sled 105. The retracted position is convenient for shipping, protecting the FPD panel, and storing the FPD panel when not in use. Additionally, because the panel is rotatably attached to a retractable tray, an FPD panel that is taller than front panel 110 can be used. Alternatively, the frame can also serve the function of the tray, thereby eliminating the need for a separate tray.

Buttons 180 serve as input devices, e.g. scroll buttons, whereby a user can manipulate information displayed on FPD panel 140, select system functions, or control system features external to FPD module 100. Other input devices, such as point devices (e.g touch pads, pointing sticks, and trackballs), dials, and switches can be included in FPD module 100. FPD panel 140 and/or buttons 180 are electrically coupled to printed circuit board 190 via a flexible electronic cable 192, such as a ribbon cable or a flex circuit. Printed circuit board 190 can include, for example, FPD panel interface electronics, server management electronics normally found on a server management card, logic required to interface the module to a system mother board, or specialized electronics such as a redundant array of inexpensive disks (RAID) controller. Alternatively, printed circuit board 190 can serve merely as a connector to ribbon cable 194, or may not be required at all for FPD module 100.

Additionally, those having ordinary skill in the art will readily recognize that a variety of different types of flat panel displays can be used for FPD panel 140. Such devices include, for example, backlit LCDs, active matrix LCDs, passive matrix LCDs, thin film transistor (TFT) LCDs, touch sensitive LCDs, electroluminescent displays, field emission displays, and plasma displays.

Figure 2:
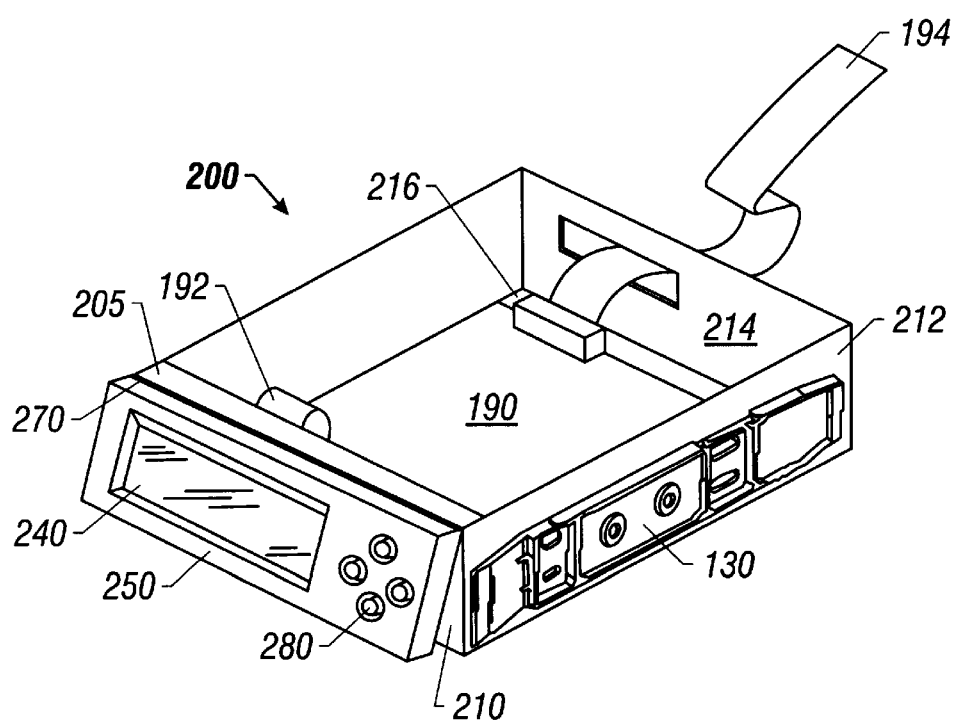
FIG. 2 shows another example of an FPD module for mounting in the peripheral device bay of a computer system.

FIG. 2 shows another example of an FPD module 200. FPD module 200 has a sled 205 similar to sled 105 of FIG. 1, and including front panel 210, side panels 212, rear panel 214, and bottom panel 216. FPD panel 240 is mounted into frame 250 which is rotatably coupled through hinges 270 to sled 205 at front panel 210. Frame 250 also includes buttons 280 that serve as input devices and are shown arranged with respect to each other in a manner common for scroll buttons. Side panels 212 include rails 130. Frame 250 is rotatable with respect to front panel 210 so that the FPD panel can be viewed from a variety of different positions. Hinges 270 either possess sufficient torque to hold frame 250 in a variety of different positions, or can include detent or catch features locking the frame in several different positions.

Figure 3:
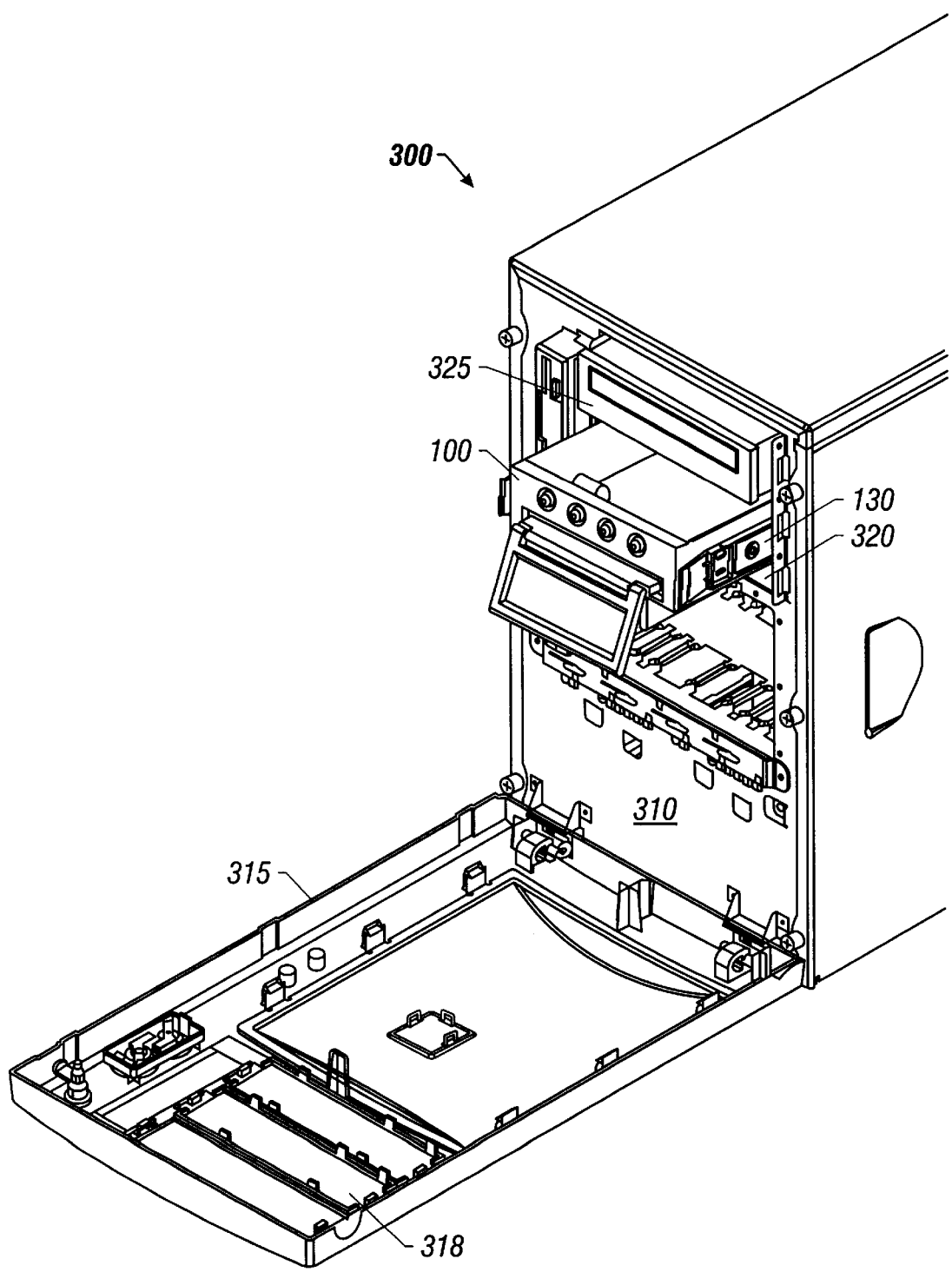
FIG. 3 illustrates the FPD module of FIG. 1 being mounted into the peripheral device bay of a computer system.

FIG. 3 illustrates FPD module 100 as it is being inserted into a computer system 300. The computer system 300 includes a chassis 310, a door 315, and a peripheral device bay 320 with a CD-ROM drive 325 already installed. FPD module 100 is inserted into peripheral device bay 320 where rails 130 are received by peripheral device bay guides (not shown), for example pairs of lances. Note that peripheral device opening face plate 318 is shown installed in door 315, and would have to be removed for proper operation of FPD module 100 once door 315 is closed. Although chassis 310 is shown in a vertical or tower configuration, the chassis can also be oriented horizontally in a desktop or rack-mount orientation. Additionally, bay 320 can be a rotatable device bay, or a bay designed to receive peripheral devices in one of several orientations. One example of such a device bay is found U.S. Pat. application Ser. No. 08/891,568 entitled "Drive bay for Alternately Orientable Computer Chassis" by R. Steven Mills and Andrew L. McAnally, filed Jul. 11, 1997, which is hereby incorporated by reference in its entirety.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A flat panel display (FPD) module comprising:
   a sled including a front panel and a pair of opposing side panels, the front panel and side panels defining an interior portion;
   an FPD panel mounted in a frame, the frame rotatably coupled through a hinge to the front panel of the sled, the frame being rotatable between a first position and a second position and;
   at least one mounting feature located on one of the side panels for mounting the module into a peripheral device bay.

2. The FPD module of claim 1 wherein the surface of the FPD panel defines a plane of the FPD panel, the plane of the FPD panel being substantially parallel to the front panel when the frame is in the first position and the plane of the FPD panel being substantially perpendicular to the front panel when the frame is in the second position.

3. The FPD module of claim 1 wherein the hinge rigidly supports the frame in a selected one of a plurality of positions between and including the first position and the second position.

4. The FPD module of claim 1 further comprising an input device located on the frame.

5. A flat panel display (FPD) module comprising:
   a sled including:
      a front panel having an aperture and a pair of opposing side panels, the front panel and side panels defining an interior portion; and
      a tray at least partially slidable through the aperture;
   an FPD panel mounted in a frame, the frame being rotatably coupled to the tray of the sled thereby allowing the frame to be rotatable between a first position and a second position when the tray is in an extended position and allowing the frame to be located in the interior portion of the sled when the tray is in a retracted position; and
   at least one mounting feature located on one of the side panels for mounting the module into a peripheral device bay.

6. The FPD module of claim 1 wherein the at least one mounting feature is selected from a slot, a hole, and a rail.

7. The FPD module of claim 1 wherein the FPD panel is selected from an active matrix liquid crystal display (LCD), a passive matrix LCD, a touch-sensitive LCD, an electroluminescent display, a field emission display, and a plasma display.

8. The FPD module of claim 1 further comprising control electronics located in the interior of the sled and electrically coupled to the FPD panel.

9. A flat panel display (FPD) module comprising:
   a sled including a front panel having an aperture and a pair of opposing side panels, the front panel and side panels defining an interior portion;
   an FPD panel mounted in a frame, the frame rotatably coupled to the sled and at least partially slidable through the aperture and rotatable between a first position and a second position when the tray is in an extended position, the frame being located in the interior portion of the sled when the frame is in a retracted position; and
   at least one mounting feature located on one of the side panels for mounting the module into a peripheral device bay.

10. The FPD module of claim 5 wherein the input device is selected from a button, a dial, and a pointing device.

11. The FPD module of claim 5 wherein the tray includes a clutch and the frame includes a shaft receivable by the clutch and allowing rotation of the frame, at least one of the shaft and the clutch including a detent feature capable of rigidly supporting the frame in a selected one of a plurality of positions between and including the first position and the second position.

12. The FPD module of claim 5 wherein the frame includes a clutch and the tray includes a shaft receivable by the clutch and allowing rotation of the frame, at least one of the shaft and the clutch including a detent feature capable of rigidly supporting the frame in a selected one of a plurality of positions between and including the first position and the second position.

13. The FPD module of claim 5 further comprising an input device located on the front panel.

14. The FPD module of claim 13 wherein the input device is selected from a button, a dial, and a pointing device.

15. A computer system comprising:
   a processor;
   a memory coupled to the processor;
   a chassis supporting the processor and the memory; and
   a flat panel display (FPD) module coupled to the chassis including:
      a sled including a front panel and a pair of opposing side panels, the front panel and side panels defining an interior portion;
      an FPD panel mounted in a frame, the frame rotatably coupled through a hinge to the front panel of the sled, the frame being rotatable between a first position and a second position and;
      at least one mounting feature located on one of the side panels for mounting the module into the chassis.

16. The computer system of claim 15 further comprising a peripheral device bay coupled to the chassis, the FPD module being coupled to the chassis through the at least one mounting feature being attached to the peripheral device bay.

17. The computer system of claim 15 further comprising control electronics located in the interior of the sled and electrically coupled to the FPD panel, the control electronics being electrically coupled to the processor.

18. The computer system of claim 15 wherein the surface of the FPD panel defines a plane of the FPD panel, the plane of the FPD panel being substantially parallel to the front panel when the frame is in the first position and the plane of the FPD panel being substantially perpendicular to the front panel when the frame is in the second position.

19. The computer system of claim 15 wherein the hinge rigidly supports the frame in a selected one of a plurality of positions between and including the first position and the second position.

20. The computer system of claim 15 further comprising an input device located on the frame.

21. A computer system comprising:
   a processor;
   a memory coupled to the processor;
   a chassis supporting the processor and the memory; and
   a flat panel display (FPD) module coupled to the chassis including:
      a sled including:
         a front panel having an aperture and a pair of opposing side panels, the front panel and side panels defining an interior portion; and
         a tray at least partially slidable through the aperture;
      an FPD panel mounted in a frame, the frame being rotatably coupled to the tray of the sled thereby allowing the frame to be rotatable between a first position and a second position when the tray is in an extended position and allowing the frame to be located in the interior portion of the sled when the tray is in a retracted position; and
      at least one mounting feature located on one of the side panels for mounting the module into the chassis.

22. A computer system comprising:
   a processor;
   a memory coupled to the processor;
   a chassis supporting the processor and the memory; and
   a flat panel display (FPD) module coupled to the chassis including:
      a sled including a front panel having an input device and a pair of opposing side panels, the front panel and side panels defining an interior portion;
      an FPD panel mounted in a frame, the frame rotatably coupled to the sled and;

at least one mounting feature located on one of the side panels for mounting the module into the chassis.

23. The computer system of claim 21 wherein the tray includes a clutch and the frame includes a shaft receivable by the clutch and allowing rotation of the frame, at least one of the shaft and the clutch including a detent feature capable of rigidly supporting the frame in a selected one of a plurality of positions between and including the first position and the second position.

24. The computer system of claim 21 wherein the frame includes a clutch and the tray includes a shaft receivable by the clutch and allowing rotation of the frame, at least one of the shaft and the clutch including a detent feature capable of rigidly supporting the frame in a selected one of a plurality of positions between and including the first position and the second position.

* * * * *